(12) United States Patent
Tamboli et al.

(10) Patent No.: US 8,263,500 B2
(45) Date of Patent: Sep. 11, 2012

(54) PHOTOELECTROCHEMICAL ETCHING FOR LASER FACETS

(75) Inventors: Adele C. Tamboli, Pasadena, CA (US); Evelyn L. Hu, Cambridge, MA (US); Steven P. DenBaars, Goleta, CA (US); Arpan Chakraborty, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 12/697,857

(22) Filed: Feb. 1, 2010

(65) Prior Publication Data

US 2010/0195684 A1 Aug. 5, 2010

Related U.S. Application Data

(60) Provisional application No. 61/148,679, filed on Jan. 30, 2009.

(51) Int. Cl.
*H01L 21/302* (2006.01)
*H01L 21/461* (2006.01)

(52) U.S. Cl. .......... 438/708; 438/718; 257/E21.22; 216/85

(58) Field of Classification Search .......... 438/708, 438/718; 257/E21.22; 216/85
See application file for complete search history.

(56) References Cited

U.S. PATENT DOCUMENTS

| 5,877,038 | A | * | 3/1999 | Coldren et al. | 438/39 |
| 6,294,475 | B1 | | 9/2001 | Schubert et al. | |
| 6,717,185 | B2 | | 4/2004 | Edmond et al. | |
| 8,052,883 | B2 | * | 11/2011 | Yang et al. | 216/24 |
| 2005/0159000 | A1 | * | 7/2005 | Ohno et al. | 438/689 |
| 2006/0110926 | A1 | | 5/2006 | Hu et al. | |
| 2010/0244053 | A1 | * | 9/2010 | Dai et al. | 257/79 |

OTHER PUBLICATIONS

Hsin-Hsuing Huang et al., "Triangular Extended Microtunnels in GaN Prepared by Selective Crystallographic Wet Cehmical Etching" May 8, 2008, Journal of the Electrochemical Society, 155 (7), pp. H504-H507.*

Haberer, E. et al., "Free-standing, optically pumped, GaN/InGaN microdisk lasers fabricated by photoelectrochemical etching," Applied Physics Letters, vol. 85, No. 22, Nov. 29, 2004, pp. 5179-5181.

Tamboli, A. et al., "Smooth top-down photoelectrochemical etching of m-plane GaN," Journal of the Electrochemical Society, 156 (1), 2009, pp. H47-H51.

International Search Report mailed Mar. 19, 2010, International application No. PCT/US10/22753, International filing date Feb. 1, 2010.

* cited by examiner

*Primary Examiner* — William D Coleman
(74) *Attorney, Agent, or Firm* — Gates & Cooper LLP

(57) ABSTRACT

A method for fabricating a semiconductor laser device, by etching facets using a photoelectrochemical (PEC) etch, so that the facets are sufficiently smooth to support optical modes within a cavity bounded by the facets.

22 Claims, 6 Drawing Sheets

PHOTOELECTROCHEMICAL ETCHING FOR LASER FACETS

CROSS REFERENCE TO RELATED APPLICATIONS

This application claims the benefit under 35 U.S.C. Section 119(e) of the following co-pending and commonly-assigned application:

U.S. Provisional Application Ser. No. 61/148,679, filed on Jan. 30, 2009, by Adele C. Tamboli, Evelyn L. Hu, Steven P. DenBaars and Arpan Chakraborty, entitled "PHOTOELECTROCHEMICAL ETCHING FOR LASER FACETS,";

which application is incorporated by reference herein.

This application is related to the following co-pending and commonly-assigned U.S. patent applications:

U.S. Utility application Ser. No. 12/464,723, filed on May 12, 2009, by Adele Tamboli, Evelyn L. Hu, Mathew C. Schmidt, Shuji Nakamura, and Steven P. DenBaars, entitled "PHOTOELECTROCHEMICAL ETCHING OF P-TYPE SEMICONDUCTOR HETEROSTRUCTURES," which application claims the benefit under 35 U.S.C. Section 119(e) of U.S. Provisional Application Ser. No. 61/052,421, filed on May 12, 2008, by Adele Tamboli, Evelyn L. Hu, Mathew C. Schmidt, Shuji Nakamura, and Steven P. DenBaars, entitled "PHOTOELECTROCHEMICAL ETCHING OF P-TYPE SEMICONDUCTOR HETEROSTRUCTURES,"; and U.S. Utility application Ser. No. 12/576,946, filed on Oct. 9, 2009, by Adele Tamboli, Evelyn L. Hu, and James S. Speck, entitled "PHOTOELECTROCHEMICAL ETCHING FOR CHIP SHAPING OF LIGHT EMITTING DIODES," which application claims the benefit under 35 U.S.C. Section 119(e) of U.S. Provisional Application Ser. No. 61/104,015, filed on Oct. 9, 2008, by Adele Tamboli, Evelyn L. Hu, and James S. Speck, entitled "PHOTOELECTROCHEMICAL ETCHING FOR CHIP SHAPING OF LIGHT EMITTING DIODES,";

which applications are incorporated by reference herein.

BACKGROUND OF THE INVENTION

1. Field of the Invention

This invention relates to photoelectrochemical (PEC) etching for laser facets.

2. Description of the Related Art

In laser diodes, one of the most difficult processing steps is the formation of high quality laser facets. The reflectivity of these facets needs to be high, the angle of the facet must be precisely determined, and ion damage should be kept to a minimum to ensure the quality of the active region. Typically, laser facets are formed by wafer cleaving, which leads to high quality facets but relies on the presence of a convenient cleave plane in the desired direction. In situations where cleaved facets are not possible (e.g., the lack of an appropriate cleavage plane, the existence of a substrate that is lattice-mismatched from the active area material, the desire to form integrated laser arrays), dry etching may be used. However, it is challenging to both produce mirror-smooth surfaces, and achieve the correct facet angle with dry etching. In addition, ion-assisted dry etching can damage the active material, degrading the laser performance. The use of simple (i.e. non PEC) wet etching to form laser facets also has limitations, since many wet etchants are crystallographic, producing etched sidewalls at angles that are determined by crystallographic planes which are not necessarily the optimal angle for a laser facet. This is illustrated in FIGS. 1 and 2.

FIGS. 1A and 1B describe isotropic etching of Silicon (Si), wherein FIG. 1A is a micrograph of an isotropic etched profile and FIG. 1B is a schematic of the isotropic etched profile, with both figures showing the etched Si 100 and $SiO_2$ etched mask 102. (These figures can be found in the publication by Madou, entitled "Fundamentals of Microfabrication," CRC Press, $2^{nd}$ Edition, p. 210.) These figures illustrate that "simple" wet-etched profiles may not be suitable for laser facets. Specifically, these figures illustrate that, even using non-PEC wet etches, without ion damage, there is no guarantee that the etched angle or profile required for a laser facet can be achieved.

FIGS. 2A and 2B describe crystallographic etching of Si, wherein FIG. 2A is a cross-section schematic and FIG. 2B is a top view schematic of an anisotropic etched profile, both showing etched Si 200 and a $SiO_2$ etched mask 202. (These figures can be found in the publication by Campbell, entitled "The Science and Engineering of Microelectronic Fabrication," Oxford University Press, $2^{nd}$ Edition, p. 528.) These figures also illustrate a cavity 204 and pyramidal hole 206 formed in the (100) Si wafer 200 with an anisotropic etchant. As noted in the figures, the surface of the $SiO_2$ etched mask 202 is oriented along the <100> plane, a sidewall of the cavity 204 is oriented along the <111> plane, and a sidewall of the pyramidal hole 206 is etched at an angle $\phi=54.74°$ relative to the surface of the $SiO_2$ etched mask 202.

For many common laser geometries, including c-plane gallium nitride (GaN) grown on sapphire, it is difficult to form cleaved laser facets (one reason for this is the sapphire substrate is lattice mismatched to the GaN). In fact, in all cases where the GaN is grown on a lattice mis-matched, misoriented substrate, the issue of cleaved facets becomes challenging.

Recently, semipolar lasers grown along the (11-22) direction have attracted interest because it is possible to get high indium content quantum wells on this crystal face, extending the range of wavelengths possible with GaN-based lasers, and in particular, enabling the development of lasers that emit longer-wavelength green light. Unfortunately, there is no convenient cleavage plane for these devices, so etched facets must be used instead.

A method for wet etching of laser facets, where the geometry of the etched sidewall can be controlled by factors other than the crystal structure of the material itself, would be desirable for all crystal planes because it would give improved control over device size and shape. However, such a method would be especially desirable for semipolar orientations where wet or dry etching is the only option. The present invention satisfies this need.

SUMMARY OF THE INVENTION

To overcome the limitations in the prior art described above, and to overcome other limitations that will become apparent upon reading and understanding the present invention, the present invention discloses a method for PEC etching of laser facets.

One of the main difficulties in the fabrication of GaN-based laser structures is the formation of smooth facets that are not compromised by ion damage. Typically, the best laser facets are formed by wafer cleaving, but many crystallographic orientations, including semipolar GaN, do not have cleavage planes that are at the appropriate angle for facet formation. It is also not possible to form cleaved facets when the structure is grown on a non-lattice matched substrate, such as GaN on sapphire.

PEC etching is a method that can be used to etch deep, anisotropic trenches in GaN with smooth sidewalls and without introducing any ion damage, and where the angle of the etched facet can be controlled by the direction of the light used to effect the etching. This technique has not yet been applied to laser facets in the GaN material system because of the difficulty in etching through thick p-type AlGaN layers, which are required for both electrical injection and cladding (carrier and optical confinement) in most laser designs.

Increased control over the etched profile using PEC etching (e.g. LED shaping using PEC etching, emphasizing the photo driven nature of the etch) has been demonstrated in U.S. Utility application Ser. No. 12/576,946, filed on Oct. 9, 2009, by Adele Tamboli, Evelyn L. Hu, and James S. Speck, entitled "PHOTOELECTROCHEMICAL ETCHING FOR CHIP SHAPING OF LIGHT EMITTING DIODES," which application claims the benefit under 35 U.S.C. Section 119(e) of U.S. Provisional Application Ser. No. 61/104,015, filed on Oct. 9, 2008, by Adele Tamboli, Evelyn L. Hu, and James S. Speck, entitled "PHOTOELECTROCHEMICAL ETCHING FOR CHIP SHAPING OF LIGHT EMITTING DIODES," which applications are incorporated by reference herein.

The ability to etch p-type GaN has been demonstrated in U.S. Utility application Ser. No. 12/464,723, filed on May 12, 2009, by Adele Tamboli, Evelyn L. Hu, Mathew C. Schmidt, Shuji Nakamura, and Steven P. DenBaars, entitled "PHOTOELECTROCHEMICAL ETCHING OF P-TYPE SEMICONDUCTOR HETEROSTRUCTURES," which application claims the benefit under 35 U.S.C. Section 119(e) of U.S. Provisional Application Ser. No. 61/052,421, filed on May 12, 2008, by Adele Tamboli, Evelyn L. Hu, Mathew C. Schmidt, Shuji Nakamura, and Steven P. DenBaars, entitled "PHOTOELECTROCHEMICAL ETCHING OF P-TYPE SEMICONDUCTOR HETEROSTRUCTURES," which application is incorporated by reference herein.

The present invention has applied these techniques to semipolar (11-22) laser structures and shown that it is possible to use PEC etching to form laser facets. Since the directionality of the etch is determined by the angle of illumination of the incident light, the present invention's technique is broadly applicable to any crystal face of GaN-based devices, however, as an example, the present invention has chosen to demonstrate the techniques using a semipolar plane because that orientation lacks a convenient cleavage plane.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

TECHNICAL DESCRIPTION

Two concepts are necessary for the present invention:

(1) the ability to etch deep, anisotropic trenches with smooth sidewalls in GaN using PEC etching (which was developed using m-plane GaN substrates); and (2) the ability to PEC etch p-type semiconductors such as p-type GaN and p-type AlGaN, as described in U.S. Utility application Ser. No. 12/464,723, filed on May 12, 2009, by Adele Tamboli, Evelyn L. Hu, Mathew C. Schmidt, Shuji Nakamura, and Steven P. DenBaars, entitled "PHOTOELECTROCHEMICAL ETCHING OF P-TYPE SEMICONDUCTOR HETEROSTRUCTURES," which application claims the benefit under 35 U.S.C. Section 119(e) of U.S. Provisional Application Ser. No. 61/052,421, filed on May 12, 2008, by Adele Tamboli, Evelyn L. Hu, Mathew C. Schmidt, Shuji Nakamura, and Steven P. DenBaars, entitled "PHOTOELECTROCHEMICAL ETCHING OF P-TYPE SEMICONDUCTOR HETEROSTRUCTURES," which applications are incorporated by reference herein. This technique is now applied to the fabrication of laser facets, for example, semipolar laser samples.

Figure 1A:
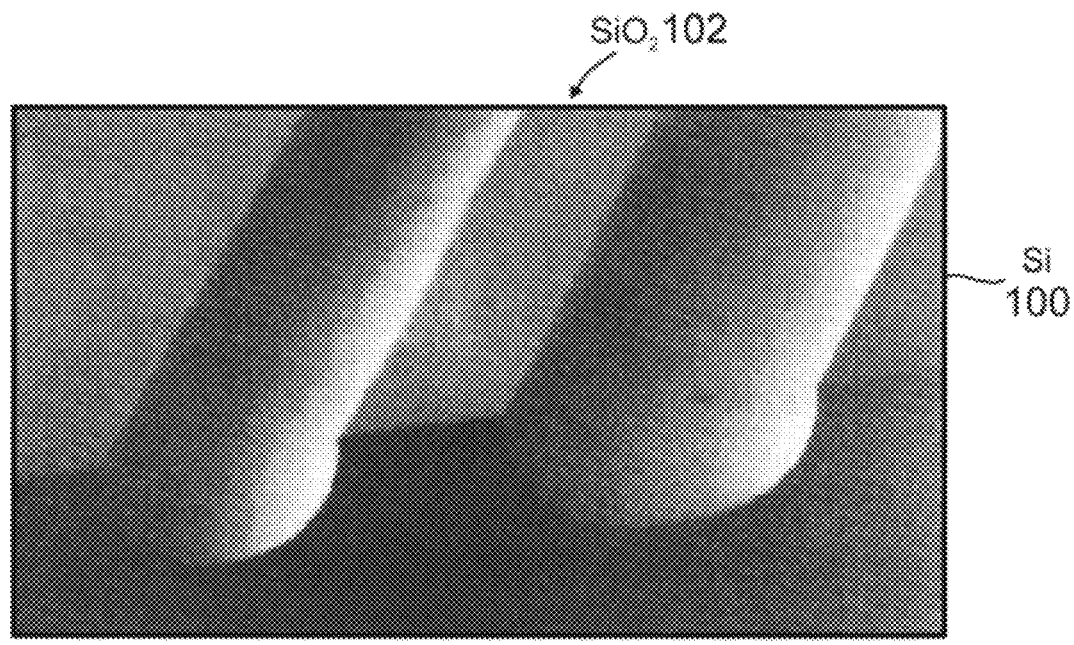
FIGS. 1A and 1B describe isotropic etching of Silicon (Si), illustrating that even using non-PEC wet etches, without ion damage, there is no guarantee that the etched angle or profile required for a laser facet can be achieved.
Figure 1B:
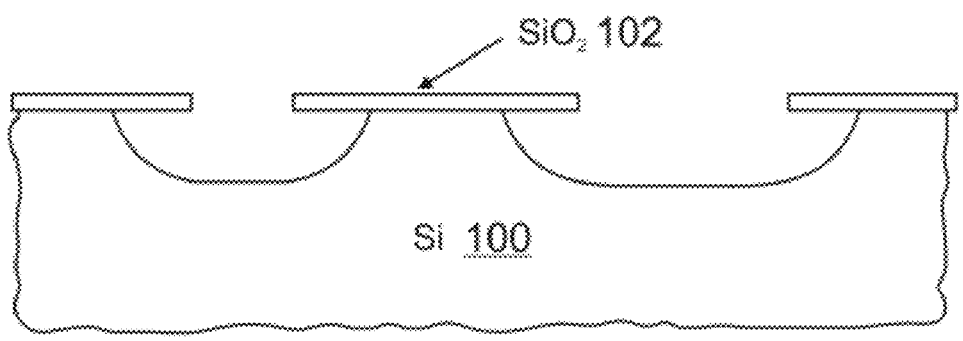
Figure 2A:
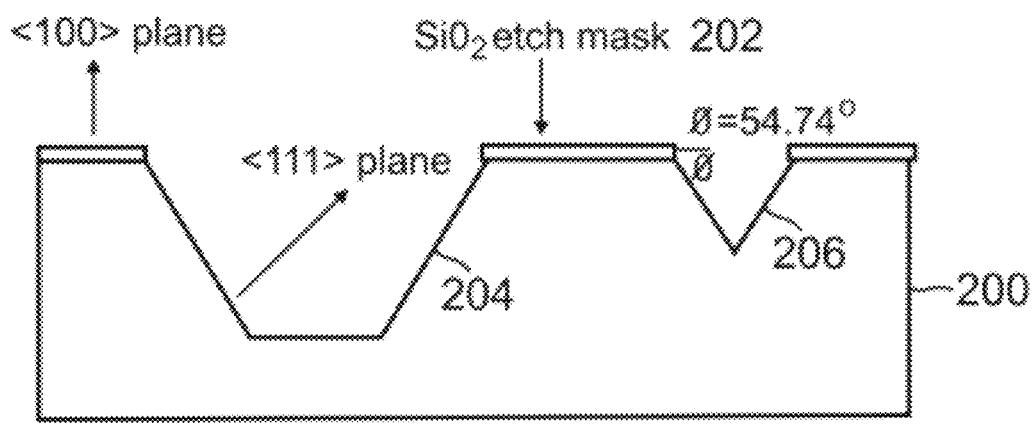
FIGS. 2A and 2B describe crystallographic etching, showing cross-section (A) and top view (B) of pyramidal holes and cavities formed in a (100) Si wafer with an anisotropic etchant.
Figure 2B:
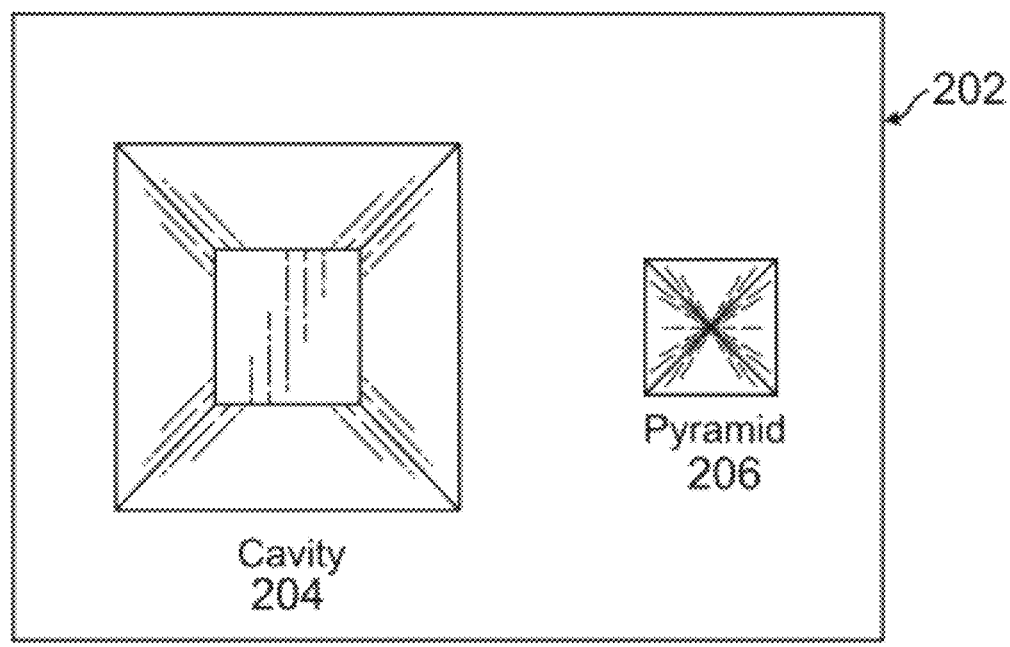
Figure 3:
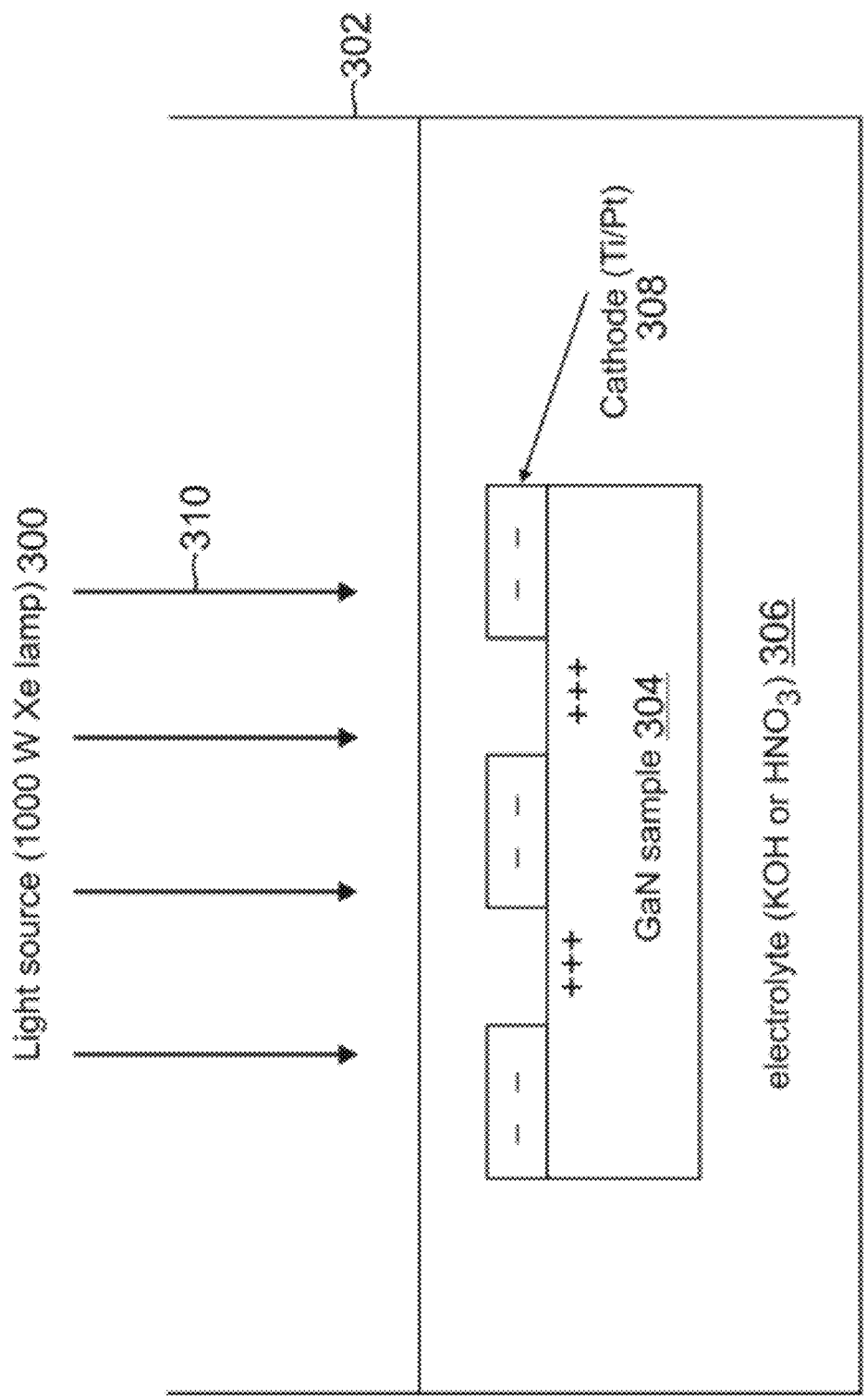
FIG. 3 is a schematic that illustrates the apparatus used in the PEC etching of the present invention.

FIG. 3 is a schematic that illustrates the apparatus used in the PEC etching of the present invention, wherein the PEC etching is a photo-assisted wet etch process that can be used to etch III-nitride semiconductors including GaN and its alloys. The apparatus is comprised of a light source 300 (e.g., a 1000 Watt Xenon lamp) and an electrochemical cell 302, where a semiconductor 304 (e.g., a GaN sample) immersed in an electrolyte 306 (e.g., KOH or $HNO_3$) acts as an anode and has metal (usually a titanium/platinum bilayer) in contact with or patterned directly thereon to act as a cathode 308. Light 310 from the light source 300 generates electron-hole pairs in the semiconductor 304, wherein electrons (−) are extracted through the cathode 308, while holes (+) participate in oxidation reactions at the semiconductor 304 surface, causing the semiconductor 304 surface to be dissolved in the electrolyte 306.

Etching of p-type semiconductors is difficult, since band-bending at the surface of p-type materials pushes holes away from the surface, preventing an oxide from forming. A method for etching p-type semiconductors, including GaN, using heterostructures has been previously developed, as described in U.S. Utility application Ser. No. 12/464,723, filed on May 12, 2009, by Adele Tamboli, Evelyn L. Hu, Mathew C. Schmidt, Shuji Nakamura, and Steven P. DenBaars, entitled "PHOTOELECTROCHEMICAL ETCHING OF P-TYPE SEMICONDUCTOR HETEROSTRUCTURES," which application claims the benefit under 35 U.S.C. Section 119(e) of U.S. Provisional Application Ser. No. 61/052,421, filed on May 12, 2008, by Adele Tamboli, Evelyn L. Hu, Mathew C. Schmidt, Shuji Nakamura, and Steven P. DenBaars, entitled "PHOTOELECTROCHEMICAL ETCHING OF P-TYPE SEMICONDUCTOR HETEROSTRUCTURES," which applications are incorporated by reference herein.

The typical laser structure used for GaN incorporates a thick (0.5 μm) p-type AlGaN layer as cladding, but the structure is amenable to the present invention's technique for PEC etching of p-GaN, so it is possible to etch through the thick p-type cladding layer as well as the rest of the structure.

Figure 4:
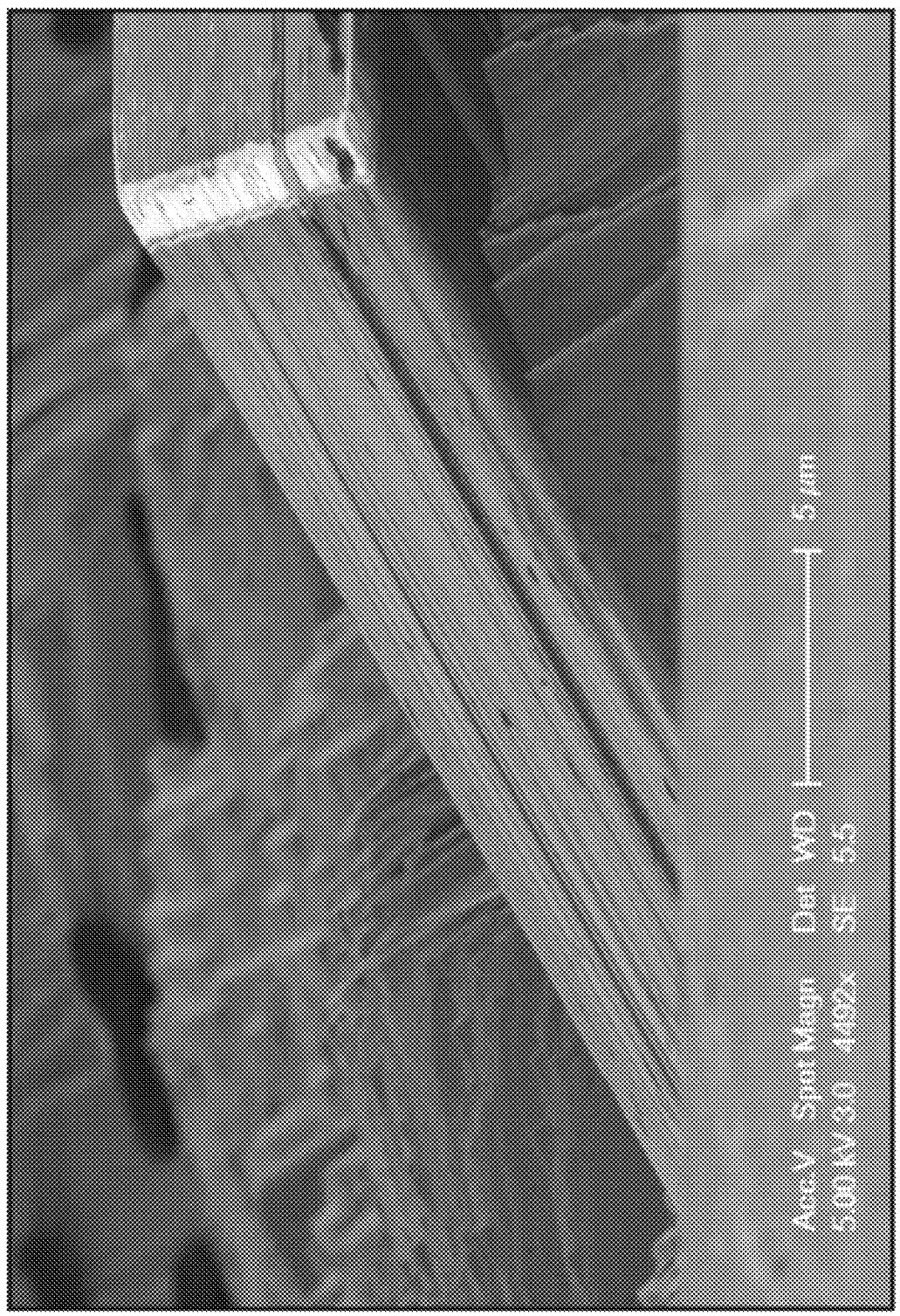
FIG. 4 shows a Scanning Electron Microscope (SEM) image of (11-22) GaN etched by the PEC process, wherein the angle of the etched plane is crystallographic under these etch conditions (as evidenced by the sloped facet).
Figure 5A:
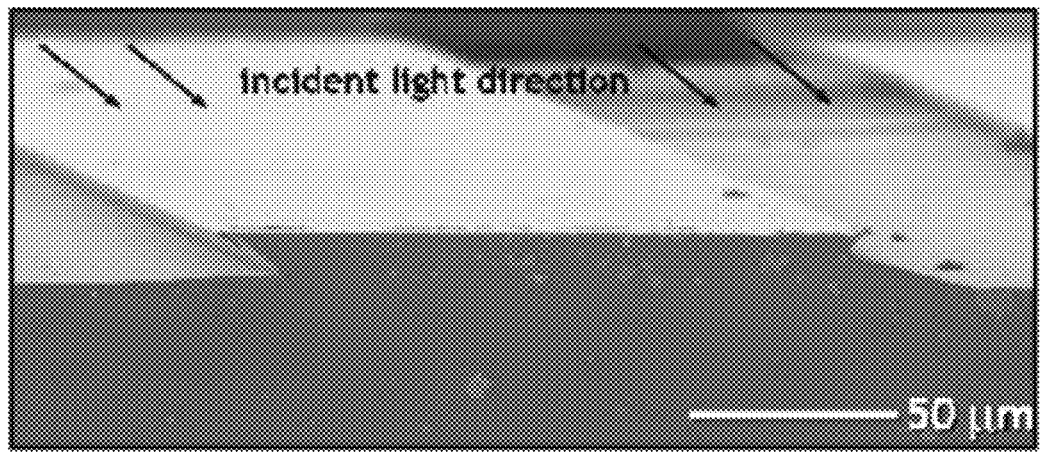
FIGS. 5A and 5B are SEM images illustrating PEC control of the angle of an etched surface according to the angle of the illumination source, and indicating very smooth etched surfaces (important for laser facets).
Figure 5B:
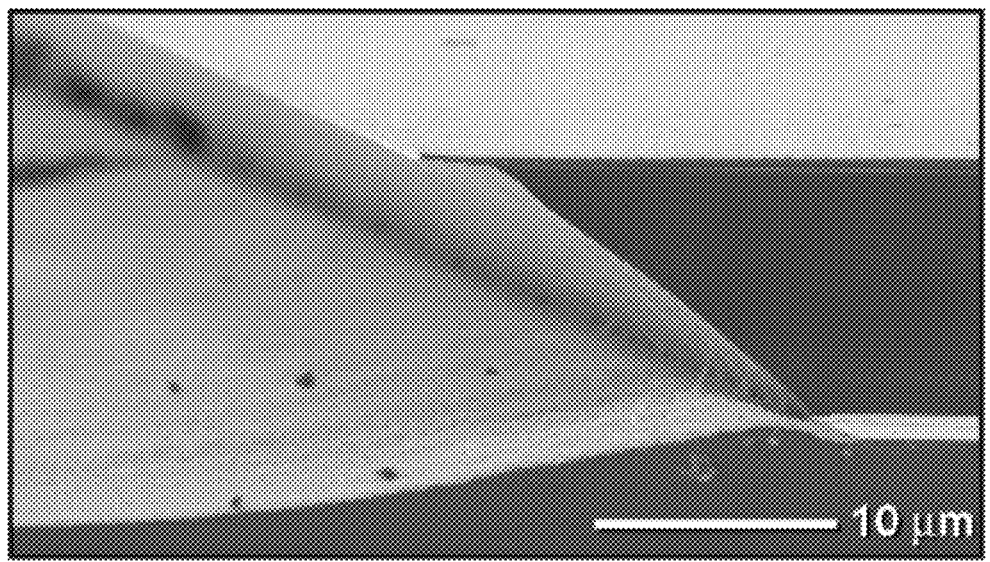

An example of two laser facets at either end of a semipolar GaN laser structure formed using PEC etching are shown in FIGS. 4 and 5A-5B.

FIG. 4 shows a Scanning Electron Microscope (SEM) image of (11-22) GaN etched by the PEC process, wherein the angle of the etched plane is crystallographic under these etch conditions (as evidenced by the sloped facet). FIGS. 5A and 5B are SEM images illustrating PEC control of the angle of an etched surface according to the angle of the illumination source, and indicating very smooth etched surfaces (important for laser facets).

More process optimization is required to achieve the smoothest etched facets, but the figures illustrate etched surfaces that depend on the angle of the incident light in PEC etching, and also indicate the possibility of very smooth etched facets. There are a multitude of parameters that can be used to fine-tune the process, including electrolyte concentration, illumination intensity, and applied bias.

PEC etching of GaN is usually performed using a broadband Xe lamp as the illumination source with KOH as the electrolyte, as shown in FIG. 3. The lamp intensity and etchant concentration are chosen based on the preferred etch rate and morphology.

For the etched facets shown in FIG. 4, the present invention used 6 M KOH, an unfiltered 1000 W Xe lamp which was focused to a spot size of about a centimeter, and no applied bias, wherein etching was performed for thirty minutes. A Ti/Pt cathode was deposited on the backside of the conductive n-type GaN substrate, and the etch mask used was a bilayer of insulating $SiN_x$ followed by Ti, leading to an insulating but opaque etch mask. To improve the quality of the etch, including reducing the crystallographic nature of the etched facets, all of these variables should be optimized.

Other types of light sources have been used, including using a GaN filter with the broadband lamp, which would still allow the p-type layer to be etched but would cause the etch to stop on the underlying n-GaN. Lasers are often used for PEC etching, and could provide enhanced control over the etch properties.

The etched profiles shown in FIGS. 5A and 5B are not the optimal ones for laser facets (but could be used for a surface emitting geometry), but these SEM images show that:

(1) the angle of the etched profile is determined by the angle of the incident light (not crystallographic planes), and (2) the etched sidewalls are smooth (no special care has been taken to make the facets "ultra" smooth).

The etches shown in FIGS. 5A and 5B were performed with a broad-area lamp. A focused laser source might produce even better, controllable facets. FIGS. 5A and 5B shows that directionality (hence angle) of the facet, or etched plane, may be determined and controlled by illumination (e.g. laser) direction, or angle of the incident light.

Other acids and bases, including NaOH, $HNO_3$, and HCl have been used to etch GaN and might prove to be better choices than KOH for reducing the crystallographic selectivity of the etch.

Other choices for masks and contacts could be used, since Ti seems to degrade under the present invention's etch conditions.

Finally, applying an external bias during etching can substantially change the resulting etch rate and morphology, and will most likely improve the results significantly.

Referring again to FIG. 4, the first demonstration of the ability to perform deep etches through a laser structure was a semipolar (11-22) sample and shows very crystallographic etch facets, which are not desirable for lasers. However, the degree of crystallographic etching can be controlled by modifying the electrolyte composition and illumination intensity during etching. This experiment showed that PEC etching can be used to etch through a laser structure, although more optimization will be necessary.

Process Steps

Figure 6:
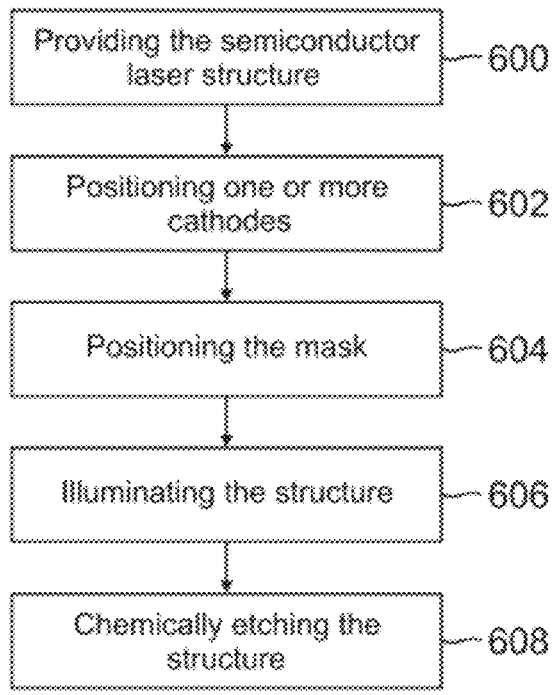
FIG. 6 is a flowchart that illustrates a method for fabricating a semiconductor laser device according to the present invention.

FIG. 6 is a flowchart that illustrates a method for fabricating a semiconductor laser device according to the present invention, by wet etching the semiconductor device so that chemical etching only proceeds in areas illuminated by light. Specifically, the method comprises etching one or more facets of the semiconductor laser using a PEC etch, so that the facets of the semiconductor laser device are sufficiently smooth to support oscillation of optical modes within a cavity of the semiconductor laser device bounded by the facets.

In one embodiment, the method includes the following steps.

Block 600 represents the step of providing the semiconductor laser device, wherein the semiconductor laser device has a structure comprising a light emitting III-nitride active layer clad between p-type III-nitride and n-type III-nitride layers, wherein the n-type III-nitride layers are formed on an n-type GaN substrate.

Block 602 represents positioning one or more cathodes on the backside of the n-type GaN substrate.

Block 604 represents positioning an insulating and opaque etch mask on the backside of the n-type GaN substrate, wherein the mask has openings.

Block 606 represents placing the structure in the apparatus of FIG. 3, so that it is immersed in the electrolyte solution and electrically coupled to a current source via the cathode, and illuminating the structure through the openings of the mask and from the backside of the n-type GaN substrate with the incident light intensity. An external bias from the current source may be applied between the cathode and a reference electrode in the electrolyte solution.

Block 608 represents etching the illuminated structure, through the openings of the mask, with the electrolyte concentration, to form the facets, which include a first facet at a first end of the structure and a second facet at a second end of the laser structure, wherein the openings are positioned above desired locations for the first and second facets, and the cathodes are positioned near the material to be etched and in contact to an n-type layer, such that the first and second facets are positioned appropriately to support the oscillation of the optical modes within the cavity bounded by the facets.

Note that Block 608 may include the step of controlling the PEC etch so that the etching of the facets is more photo driven and less chemically driven.

For example, the controlling step may comprise balancing an incident light intensity with electrolyte concentration for the PEC etch. The controlling step may include determining an etched profile of the facets by an incident light direction for the PEC etch, wherein the etching only proceeds in areas illuminated by the incident light for the PEC etch. Further, the balancing step may include selecting a balance between the incident light intensity with the electrolyte concentration for the PEC etch to achieve a more rapid and deeper etching.

In another example, the etching may be controlled to not be crystallographic so that the facets are not along a cleavage plane of the semiconductor laser device. In this regard, the etching may be controlled to not be crystallographic by modifying the electrolyte composition and the incident light intensity during the etching.

Figure 7:
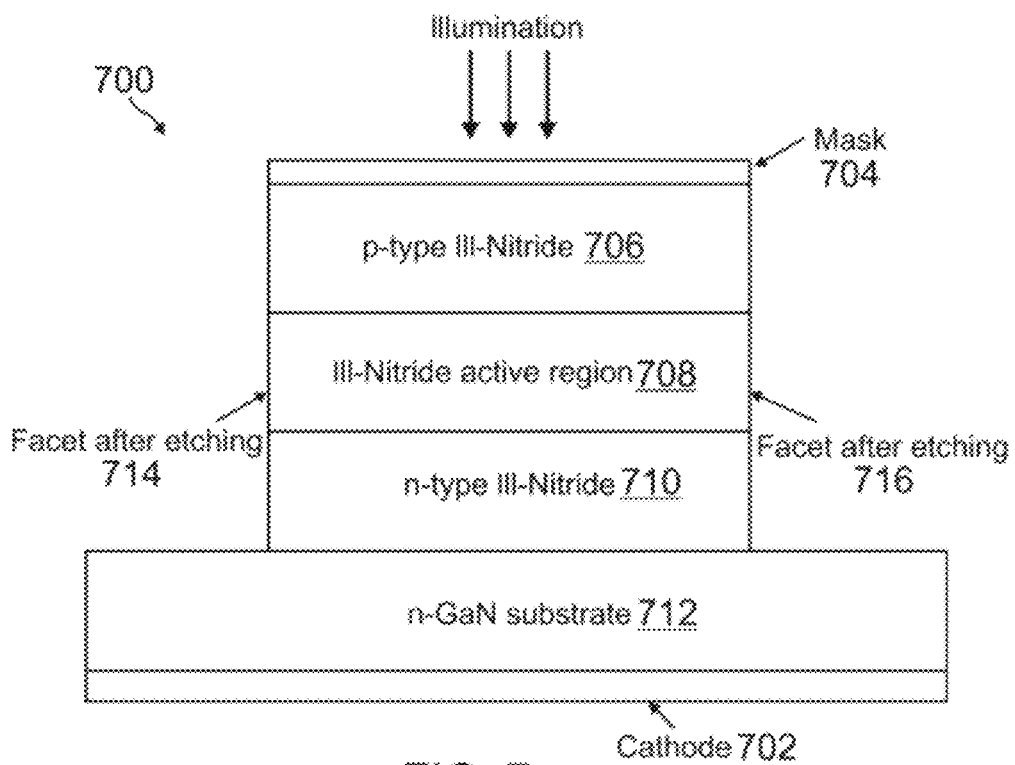
FIG. 7 is a cross-sectional schematic of a laser device structure used in the etching method of FIG. 6.

FIG. 7 is a cross-sectional schematic of a laser device structure 700 used in the etching method of FIG. 6, showing the cathode 702, mask 704, p-type III-nitride 706, light emitting III-nitride active region 708, n-type III-nitride 710, n-type GaN substrate 712, and facets 714 and 716.

The end result of this method is a semiconductor laser device having a cavity bounded by facets which are not crystallographic and are not along a cleavage plane of the semiconductor laser device. Preferably, as noted above, the facets of the semiconductor laser device are positioned appropriately and sufficiently smooth to support oscillation of optical modes within a cavity of the semiconductor laser device bounded by the facets.

Possible Modifications

The term "III-nitride" as used herein, and the equivalent terms "Group-III nitride", "(Al,Ga,In)N", "$Al_{(1-x-y)}In_yGa_xN$" where $0 \leq x \leq 1$ and $0 \leq y \leq 1$, or "III-V nitride," are intended to be broadly construed to include the respective nitrides of Al, Ga, and In, as well as binary, ternary and quaternary compositions or alloys of such III-nitrides. Accordingly, these terms include the compounds AlN, GaN, and InN, as well as the ternary compounds AlGaN, GaInN, and AlInN, and the quaternary compound AlGaInN. When two or more of the (Al, Ga,In) component species are present, all possible compositions, including stoichiometric proportions as well as "off-stoichiometric" proportions (with respect to the relative mole fractions present of each of the (Al,Ga,In) component species that are present in the composition), can be employed within the broad scope of the invention. Accordingly, it will be appreciated that the specific discussion herein with reference to GaN is also applicable more generally to the formation of various other (Al,Ga,In)N materials. Further, (Al,Ga,In)N materials within the scope of the invention may further include minor quantities of dopants and/or other impurity or inclusional materials.

The present invention's first demonstration of this technique led to highly crystallographic etching, resulting in inclined facets, which is not desirable. For high quality facets, it will be necessary to optimize the process steps of FIG. 6 such that the etch is more photo driven and less chemically driven, which will require balancing the light intensity with electrolyte concentration. With the proper balance, it is possible to get rapid, deep etching where the etched profile is determined by the incident light direction.

Advantages and Improvements

Lasers with facets formed using this method could have smoother facets with less ion damage than lasers with facets formed using dry etching. This process will improve the performance of III-nitride lasers, especially those with no convenient cleavage plane. Dry etching could be eliminated from the process completely, reducing the ion damage to, and roughness of, the cavity.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for fabricating a semiconductor laser device, comprising:
   forming one or more facets of the semiconductor laser device that are not compromised by ion damage, wherein the facets are formed by etching the facets using only a photoelectrochemical (PEC) etch, the etched facets are not crystallographic, the etched facets are not along a cleavage plane of the semiconductor laser device, and the etched facets are positioned appropriately and are sufficiently smooth to support oscillation of optical modes within a cavity of the semiconductor laser device bounded by the facets.

2. The method of claim 1, wherein the semiconductor laser device is comprised of a III-nitride semiconductor.

3. The method of claim 1, further comprising controlling the PEC etch so that the etching of the facets is more photo driven and less chemically driven.

4. The method of claim 3, wherein the controlling step further comprises balancing an incident light intensity with electrolyte concentration for the PEC etch.

5. The method of claim 4, wherein the controlling step further comprises determining an etched profile of the facets by an incident light direction for the PEC etch.

6. The method of claim 4, wherein the etching is controlled to not be crystallographic so that the facets are not along a cleavage plane of the semiconductor laser device.

7. The method of claim 4, further comprising:
   providing the semiconductor laser device, wherein the semiconductor laser device has a structure comprising a III-nitride active layer clad between p-type III-nitride and n-type III-nitride layers, wherein the n-type III-nitride layer is on an n-type GaN substrate;
   positioning one or more cathodes on a backside of the n-type GaN substrate;
   positioning an insulating and opaque etch mask on the backside of the n-type GaN substrate, wherein the mask has openings;
   illuminating the structure through the openings of the mask and from the backside of the n-type GaN substrate with the incident light intensity;
   etching the illuminated structure, through the openings of the mask, with the electrolyte concentration to form the facets, which include a first facet at a first end of the structure and a second facet at a second end of the laser structure, wherein the openings of the mask are positioned above desired locations for the first and second facets, and the cathodes are positioned near material to be etched and in contact to the n-type GaN substrate, such that the first and second facets are positioned appropriately to support the oscillation of the optical modes within the cavity bounded by the facets.

8. The method of claim 4, further comprising: applying an external bias during etching to change a resulting etch rate and morphology.

9. The method of claim 5, wherein the etching only proceeds in areas illuminated by the incident light for the PEC etch.

10. The method of claim 5, wherein the balancing step further comprises selecting a balance between the incident light intensity with the electrolyte concentration for the PEC etch to achieve a more rapid and deeper etching.

11. The method of claim 6, wherein etching is controlled to not be crystallographic by modifying the electrolyte composition and the incident light intensity during the etching.

12. A method of fabricating a semiconductor laser device, comprising:
forming one or more facets of the semiconductor laser device that are not comprised by ion damage, wherein the facets are formed by wet etching the semiconductor laser device, so that chemical etching only proceeds in areas illuminated by light, and wherein the wet etching comprises etching the facets of the semiconductor laser device using only a photoelectrochemical (PEC) etch, and the etched facets are positioned appropriately and are sufficiently smooth to support oscillation of optical modes within a cavity of the semiconductor laser device bounded by the facets.

13. The method of claim 12, wherein the semiconductor laser device is comprised of a III-nitride semiconductor.

14. The method of claim 12, further comprising controlling the PEC etch so that the etching of the facets is more photo driven and less chemically driven.

15. The method of claim 12, wherein the etched facets are not crystallographic and are not along a cleavage plane of the semiconductor laser device.

16. The method of claim 12, further comprising:
providing the semiconductor laser device, wherein the semiconductor laser device has a structure comprising a III-nitride active layer clad between p-type III-nitride and n-type III-nitride layers, wherein the n-type III-nitride layer is on an n-type GaN substrate;
positioning one or more cathodes on a backside of the n-type GaN substrate;
positioning an insulating and opaque etch mask on the backside of the n-type GaN substrate, wherein the mask has openings;
illuminating the structure through the openings of the mask and from the backside of the n-type GaN substrate with the incident light intensity;
etching the illuminated structure, through the openings of the mask, with the electrolyte concentration to form the facets, which include a first facet at a first end of the structure and a second facet at a second end of the laser structure, wherein the openings of the mask are positioned above desired locations for the first and second facets, and the cathodes are positioned near material to be etched and in contact to the n-type GaN substrate, such that the first and second facets are positioned appropriately to support the oscillation of the optical modes within the cavity bounded by the facets.

17. The method of claim 12, further comprising: applying an external bias during etching to change a resulting etch rate and morphology.

18. The method of claim 14, wherein the controlling step further comprises balancing an incident light intensity with electrolyte concentration for the PEC etch.

19. The method of claim 18, wherein the controlling step further comprises determining an etched profile of the facets by an incident light direction for the PEC etch.

20. The method of claim 18, wherein the balancing step further comprises selecting a balance between the incident light intensity with the electrolyte concentration for the PEC etch to achieve a more rapid and deeper etching.

21. The method of claim 15, wherein the etching is controlled to not be crystallographic so that the facets are not along a cleavage plane of the semiconductor laser device.

22. The method of claim 21, wherein etching is controlled to not be crystallographic by modifying the electrolyte composition and the incident light intensity during the etching.

* * * * *